United States Patent
Benz et al.

Patent Number: 5,093,631
Date of Patent: Mar. 3, 1992

[54] GAIN-CONTROLLED BROADAND AMPLIFIER STAGE

[75] Inventors: Paul Benz, Stuttgart; Günther Lippold, Ostfildern, both of Fed. Rep. of Germany

[73] Assignee: Alcatel N.V., Amsterdam, Netherlands

[21] Appl. No.: 626,526

[22] Filed: Dec. 12, 1990

[30] Foreign Application Priority Data

Dec. 23, 1989 [DE] Fed. Rep. of Germany ....... 3942936

[51] Int. Cl.[5] .............................................. H03G 3/30
[52] U.S. Cl. .................................... 330/285; 330/277
[58] Field of Search ....................... 330/285, 277, 290

[56] References Cited

U.S. PATENT DOCUMENTS 4,420,724  12/1983  Owen ................................. 330/277
4,943,785  7/1990  Benz et al. .......................... 330/285

Primary Examiner—Eugene R. Laroche
Assistant Examiner—Tan Dinh
Attorney, Agent, or Firm—Spencer & Frank

[57] ABSTRACT

A broadband amplifier stage includes a field-effect transistor as an amplifying element whose gain is varied with the aid of the drain current at a fixed drain-source voltage $U_{DS}$ and requires higher-than-usual supply voltages to fulfill the condition $U_{DS}$=constant. The DC gain of the amplifying element is not generally sufficient to keep the drain-source voltage constant at small currents. According to the invention, a high-gain operational amplifier is inserted into the feedback path to stabilize the drain-source voltage. The voltage source $-U_1$ for adjusting the gate bias then drives a constant current through the voltage divider, thus maintaining the drain-source voltage $U_{DS}$ constant.

11 Claims, 2 Drawing Sheets

GAIN-CONTROLLED BROADAND AMPLIFIER STAGE

BACKGROUND OF THE INVENTION

The present invention relates to an AC voltage amplifier particularly a gain-controlled broadband amplifier stage comprising a field effect transistor as described in German Patent Application 38 14 041 and corresponding U.S. Pat. No. 4,943,785 which issued on July 24th, 1990.

The above application describes a broadband amplifier stage whose amplifying element is a first field-effect transistor. The drain terminal of the field-effect transistor is connected through a resistor to the source terminal of a second field-effect transistor, henceforth called "control transistor", which controls the drain current of the first field-effect transistor. The source terminal of the control transistor is grounded through a capacitor to provide a path for RF currents. Since the transconductance of a field-effect transistor is proportional to the root of the drain current, the gain of the broadband amplifier stage can be controlled by controlling the drain current. The gate bias of the field-effect transistor is derived from a voltage divider connected at one end to the drain terminal of the field-effect transistor and at the other end to a negative voltage source. From the tap of the voltage divider, the gate potential is applied through a coupling resistor to the gate of the first field-effect transistor. The broadband amplifier stage works satisfactorily only when the first field-effect transistor is operated in the pinch-off region of its family of output characteristics. With a full variation of the gain in a ratio of about 1 : 4, operation in the pinch-off region is possible only if the supply voltage has a sufficient magnitude, about 12 volts. For commonly used supply voltages, such as ±5 volts, the gain of the field-effect transistor is not sufficient to ensure operation in the pinch-off region, i.e., at a fixed drain-source voltage, at small currents.

SUMMARY OF THE INVENTION

It is, therefore, the object of the invention to improve the broadband amplifier stage so that the drain-source voltage of the first field-effect transistor remains constant even at small currents. This object is attained by a broadband amplifier stage including a field effect transistor connected in a common source configuration and having a gate terminal, a source terminal and a drain terminal where the gate terminal receives an input voltage to be amplified; first means for varying the gain of the field effect transistor by controlling the amount of drain current flowing through the field-effect transistor; and second means for regulating a drain-source voltage of the field-effect transistor at a constant value when the field-effect transistor is being operated in the pinch-off region.

The broadband amplifier stage according to the invention has the advantage of operating satisfactorily even at the usual supply voltages, e.g., ±5 volts. In addition to the gain of the amplifying element, i.e., the field-effect transistor, a high-gain operational amplifier is provided which drives a constant current through the voltage divider generating the gate bias, thus maintaining the drain-source voltage of the field-effect transistor constant. Another advantage of the invention is that the source terminal of the field-effect transistor is at ground potential.

BRIEF DESCRIPTION OF THE DRAWINGS

The invention will now be explained by way of example, with reference to the accompanying drawings, in which.

DESCRIPTION OF THE PREFERRED EMBODIMENTS

Figure 1:
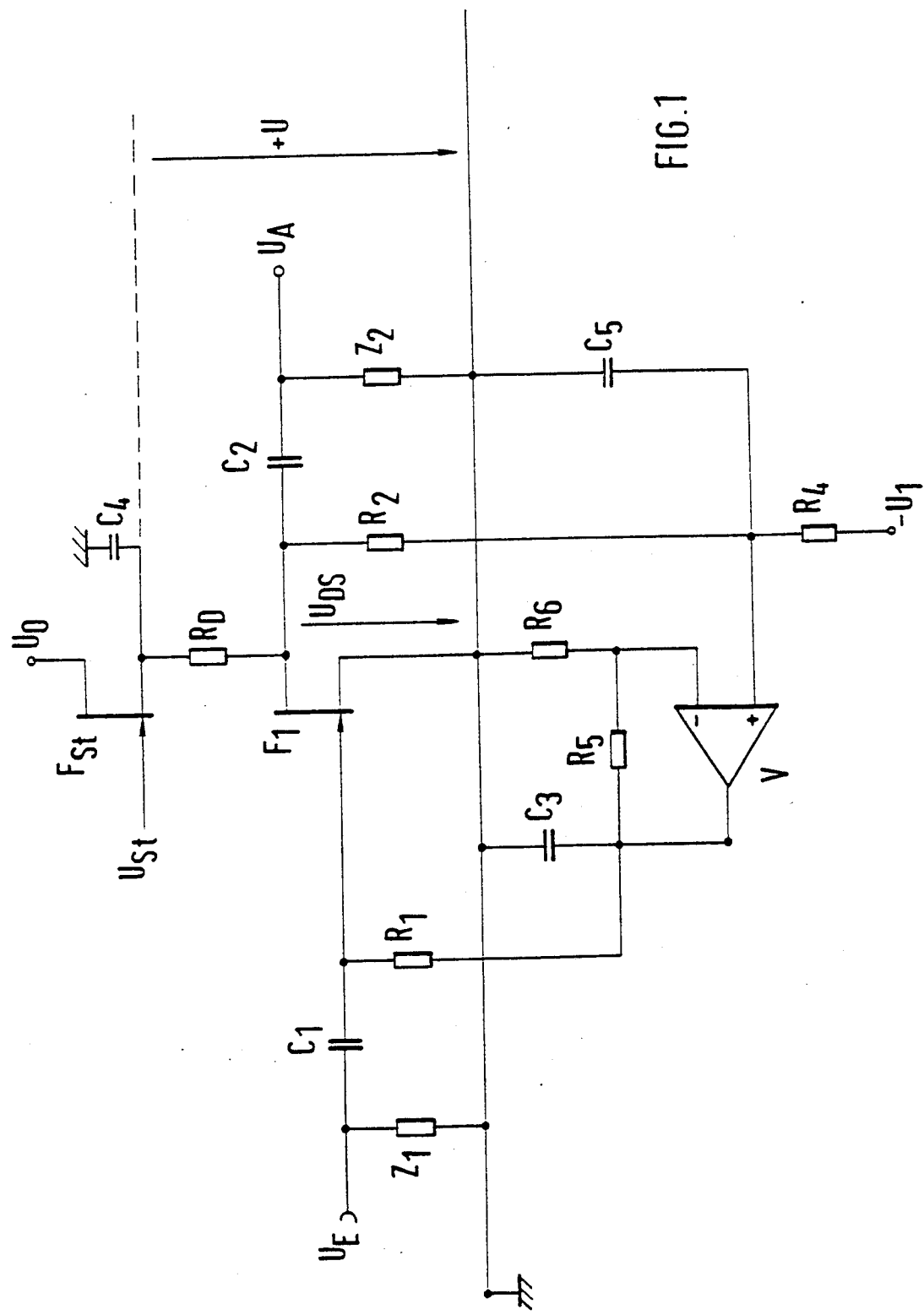
FIG. 1 is a schematic circuit diagram of a first embodiment of the broadband amplifier stage in accordance with the invention.

The reference character $F_1$ denote a field-effect transistor which is to amplify an input AC voltage $U_E$. Its source terminal is grounded, and its drain terminal is connected through a resistor $R_D$ to the source terminal of a control transistor $F_{St}$. The gate of the control transistor $F_{St}$ has a control voltage $U_{St}$ applied to it. The drain terminal of the control transistor $F_{St}$ is connected to a voltage source which delivers a positive voltage. The source terminal of the control transistor $F_{St}$ is grounded through a capacitor $C_4$ to provide a path for RF currents. From the drain terminal of the transistor $F_1$, a voltage divider consisting of two resistors $R_2$ and $R_4$ is connected to a negative voltage $-U_1$. The tap of the voltage divider is connected to ground through a capacitor $C_5$ and to the noninverting input of an operational amplifier V. Negative feedback is applied to the inverting input of the amplifier V via two resistors $R_5$ and $R_6$. In addition, the output of the operational amplifier is grounded through a capacitor $C_3$. The output of the amplifier V is applied through a resistor $R_1$ to the gate of the transistor $F_1$. An input impedance $Z_1$ serves to match an input voltage source to the input of the amplifier stage. A coupling capacitor $C_1$ provides DC isolation between the input of the amplifier stage and the gate of the transistor $F_1$. The source terminal of the transistor $F_1$ is connected through a capacitor $C_2$ to an output impedance $Z_2$, across which the amplified input voltage is taken as an output voltage $U_A$.

The broadband amplifier stage works as follows. The amplifying element is the field-effect transistor $F_1$. To vary the gain, the current through the field-effect transistor $F_1$ is controlled. This is done with the control transistor $F_{St}$. The drain terminal of the latter is tied to the positive DC voltage $U_0$. By varying the voltage applied to the gate of the control transistor $F_{St}$, designated $U_{St}$ in the figure, the voltage $+U$ across the series combination of the resistor $R_D$ and the field-effect transistor $F_1$ is varied. Since in the pinch-off region of the family of output characteristics of a field-effect transistor the voltage $U_{DS}$ is greater than 3 V and is to be maintained constant, the current through the field-effect transistor $F_1$ changes as a result of this measure. The gate voltage necessary for the respective operating point is adjusted by the voltage divider consisting of the resistors $R_2$ and $R_4$. As the field-effect transistor $F_1$ must be operated with a negative bias, one end of the resistor $R_4$ is tied to the voltage $-U_1$. In the prior art circuit, the potential at the tap of the voltage divider consisting of the resistors $R_2$ and $R_4$ is applied through a coupling resistor to the gate of the field-effect transistor $F_1$. The invention consists in the fact that the operational amplifier V is connected between the gate and the tap. At smaller values of $U_0$, the DC voltage gain of the field-effect transistor $F_1$ does not suffice to maintain the drain source voltage $U_{DS}$ constant. By inserting the amplifier V, the overall gain of the feedback path is increased, so that $U_{DS}$ will remain constant even at supply voltages $U_0 = 5$ volts. Changes $\Delta U$ in the potential at the tap of the voltage divider are now multiplied by the gain A of the operational amplifier. The gate-source voltage $U_{gs}$ is given by $$U_{gs} = -\Delta U \cdot A$$

Since no current is flowing into the operational amplifier, the negative voltage $-U_1$ impresses on the voltage divider consisting of the resistors $R_2$ and $R_4$ a current which results in a drain-source voltage $$U_{DS} = \frac{|-U_1|}{R_4} \cdot R_2 = \text{constant}.$$

The drain current $I_D$ is $$I_D = \frac{+U_1 - U_{DS}}{R_D} = \text{variable}.$$

The input impedance $Z_1$ and the output impedance $Z_2$ depend on the intended use of the broadband amplifier stage. They may be impedances which serve to match the circuit to lines, but also impedances which result in a mismatch. The broadband amplifier stage according to the invention has a constant gain from 1 kHz to about 2 GHz. It should be pointed out that the source terminal of the field-effect transistor $F_1$ is grounded directly, i.e., the source lead contains no RC sections that could cause undesired oscillations. Even at commonly used supply voltages $U_0$ of $\pm 5$ volts, a variation of the gain in the ratio of 1 : 4 is possible. It is not imperative to adjust the voltage $+U$ with the aid of the control transistor $F_{St}$. The advantage of using a field-effect transistor for adjusting the voltage $+U$ lies in the fact that no control power is needed. Other ways of controlling the drain current are possible. Instead of a field-effect transistor $F_{St}$, for example, bipolar transistors can be used as controlled current sources. What is essential is that the means for controlling the voltage $+U$ shall be grounded to provide a path for RF currents.

Figure 2:
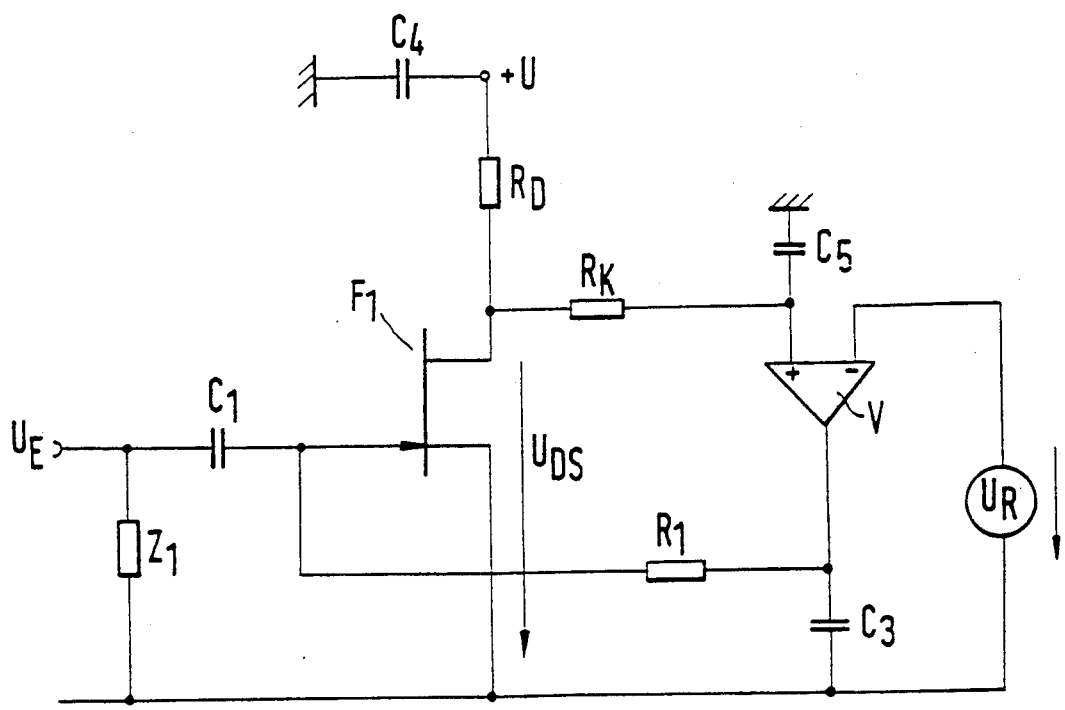
FIG. 2 is a schematic circuit diagram of a second embodiment of the broadband amplifier stage in accordance with the invention.

FIG. 2 shows a second embodiment of the broadband amplifier stage according to the invention. Similar reference characters have been used to designate elements having the same functions as in FIG. 1. The amplifying element of the amplifier stage, the field-effect transistor $F_1$, has the input voltage UE applied to it through the coupling capacitor $C_1$. Like in FIG. 1, the source terminal of $F_1$ is at ground potential. The voltage $+U$ is applied through the resistor $R_D$. The voltage at the drain terminal is applied through a coupling resistor $R_K$ to the noninverting input of the operational amplifier V, which input is grounded through the capacitor $C_5$. The inverting input of the operational amplifier V is tied to a reference voltage $U_R$ which acts as a desired value for the drain-source voltage $U_{DS}$. The output of the operational amplifier V is connected through the resistor $R_1$ to the gate terminal of field effect transistor $F_1$. It is grounded through the capacitor $C_3$ to provide a path for RF currents. In this embodiment, too, small changes in the drain-source voltage $U_{DS}$ are amplified by the operational amplifier V and result in the gate potential being shifted so that the original value of the drain source voltage is obtained.

The extraction of the output signal was not described, since this is familiar to those skilled in the broad-band-amplifier art.

We claim:

1. A broadband amplifier stage comprising:
    a field-effect transistor connected in a common source configuration and having a gate terminal for receiving an input voltage to be amplified, a source terminal and a drain terminal;
    first means, connected to the drain terminal of the field-effect transistor, for varying the gain of said field-effect transistor by controlling the amount of drain current flowing through said field-effect transistor; and
    second means connected to the drain terminal of the field-effect transistor, said second means comprising an operational amplifier and having an output, said amplifier being a regulator for regulating a drain-source voltage of said field-effect transistor at a constant value when said field-effect transistor is being operated in the pinch-off region.

2. A broadband amplifier stage as claimed in claim 1, wherein the second means further includes a voltage divider which is connected between the drain terminal of said field-effect transistor and the negative terminal of a second voltage source, said voltage divider being traversed by a constant current.

3. A broadband amplifier stage as claimed in claim 2, wherein said voltage divider has a tap, said operational amplifier has an inverting and a noninverting input, and the tap of said voltage divider is connected to the noninverting input of said operational amplifier.

4. A broadband amplifier stage as claimed in claim 3, further comprising means for applying a negative feedback to said operational amplifier connected between said field-effect transistor and the inverting input of said operational amplifier.

5. A broadband amplifier stage as claimed in claim 4 wherein said negative feedback applying means includes at least two resistors, one end of each resistor being connected to the inverting input of said operational amplifier, the other end of each respective resistor respectively being connected to the source terminal and gate terminal of said field-effect transistor.

6. A broadband amplifier stage as claimed in claim 1, further comprising a resistor, the output of the operational amplifier being connected via said resistor to the gate terminal of said field-effect transistor.

7. A broadband amplifier stage as claimed in claim 1, further comprising means for applying negative feedback to said operational amplifier.

8. A broadband amplifier stage as claimed in claim 1, further comprising a coupling resistor wherein said operational amplifier has an inverting and noninverting input and the drain-source voltage is applied through said coupling resistor to the noninverting input of the operational amplifier.

9. A broadband amplifier stage as claimed in claim 8, wherein the inverting input of the operational amplifier is connected to a reference voltage.

10. A broadband amplifier stage comprising:
    a field-effect transistor connected in a common source configuration and having a gate terminal for receiving an input voltage to be amplified, a source terminal and a drain terminal;

first means, connected to the drain terminal of the field-effect transistor, for varying the gain of said field-effect transistor by controlling the amount of drain current flowing through said field-effect transistor, said first means comprising a control transistor which controls the drain current of said field-effect transistor; and second means, connected to the drain terminal of the field-effect transistor, for regulating a drain-source voltage of said field-effect transistor at a constant value when said field-effect transistor is being operated in the pinch-off region.

11. A broadband amplifier stage as claimed in claim 10, wherein the source terminal of said control transistor is connected to ground to provide a path for the flow of RF currents.

* * * * *

UNITED STATES PATENT AND TRADEMARK OFFICE
CERTIFICATE OF CORRECTION

PATENT NO. : 5,093,631
DATED : March 3rd, 1992
INVENTOR(S) : Paul BENZ and Günther LIPPOLD It is certified that error appears in the above-identified patent and that said Letters Patent is hereby corrected as shown below:

Title page:
Item 54, change the title from "GAIN-CONTROLLED BROADAND AMPLIFIER STAGE" to --GAIN-CONTROLLED BROADBAND AMPLIFIER STAGE--.

Signed and Sealed this

Fourth Day of May, 1993

Attest:

MICHAEL K. KIRK

Attesting Officer     Acting Commissioner of Patents and Trademarks